(12) United States Patent
Ahlers et al.

(10) Patent No.: US 6,465,869 B2
(45) Date of Patent: Oct. 15, 2002

(54) COMPENSATION COMPONENT AND PROCESS FOR PRODUCING THE COMPENSATION COMPONENT

(75) Inventors: Dirk Ahlers; Frank Pfirsch, both of München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/867,502

(22) Filed: May 30, 2001

(65) Prior Publication Data

US 2001/0048144 A1 Dec. 6, 2001

(30) Foreign Application Priority Data

May 30, 2000 (DE) .......................... 100 26 924

(51) Int. Cl.⁷ .................. H01L 29/00; H01L 29/76; H01L 29/94; H01L 31/113; H01L 31/119
(52) U.S. Cl. .................. 257/548; 257/544; 257/509; 257/510; 257/514; 257/513; 257/332
(58) Field of Search ................. 257/510–521, 257/128, 263, 332, 282, 509, 544, 548

(56) References Cited

U.S. PATENT DOCUMENTS

| | | | | |
|---|---|---|---|---|
| 4,561,172 A | * | 12/1985 | Slawinski et al. | 29/576 |
| 4,754,310 A | | 6/1988 | Coe | |
| 5,378,920 A | * | 1/1995 | Nakagawa et al. | 257/487 |
| 5,451,805 A | * | 9/1995 | Yang | 257/341 |
| 5,841,169 A | * | 11/1998 | Beason | 257/355 |
| 6,005,279 A | * | 12/1999 | Luning | 257/510 |
| 6,020,600 A | * | 2/2000 | Mihyajima et al. | 257/76 |
| 6,046,487 A | * | 4/2000 | Benedict et al. | 257/510 |
| 6,316,807 B1 | * | 11/2001 | Fujishima et al. | 257/333 |
| 6,368,920 B1 | * | 4/2002 | Beason | 438/270 |

FOREIGN PATENT DOCUMENTS

EP 0973203 A2 1/2000

* cited by examiner

*Primary Examiner*—Eddie Lee
*Assistant Examiner*—Jesse A. Fenty
(74) *Attorney, Agent, or Firm*—Laurence A. Greenberg; Werner H. Stemer; Ralph E. Locher

(57) ABSTRACT

A compensation component includes a drift path formed of p-conducting and n-conducting layers which are led around or along a trench. A process for producing the compensation component is also provided.

11 Claims, 2 Drawing Sheets

COMPENSATION COMPONENT AND PROCESS FOR PRODUCING THE COMPENSATION COMPONENT

BACKGROUND OF THE INVENTION

FIELD OF THE INVENTION

The present invention relates to a compensation component and to a process for its production. Compensation components are known to be distinguished by the fact that they have a drift path, which is made up in the direction of current flow by n-conducting and p-conducting regions disposed next to or above one another and alternating with one another. In that case, the n-conducting and p-conducting regions are doped to such a level that their charges compensate for one another and, in the case of blocking, the entire drift path is cleared of charges. In the case of conduction or passage, however, the n-conducting and p-conducting regions contribute significantly more to the current flow than regions of one type of conduction, that is for example n-conducting regions, in the case of conventional components.

With a high blocking capability, compensation components consequently have a low on resistance $R_{on}$.

Compensation components are known to be constructed both as vertical components and as lateral components (in that respect, see U.S. Pat. Nos. 4,754,310 and 5,216,275). In the case of vertical components, the source electrode and gate electrode are, for example, located on an upper side of a semiconductor body, while the drain electrode is provided on an underside, lying opposite the upper side. The compensation regions are then n-conducting and p-conducting layers, also known as columns, which extend, alternating with one another, in the interior of the semiconductor body in the direction between the source and drain.

In the case of lateral components, two V-shaped grooves or trenches may have been introduced into a semiconductor body. One of those trenches receives the source electrode and the gate electrode, while the other trench is intended for the drain electrode. The compensation regions are provided in that case as n-conducting and p-conducting layers disposed above one another and alternating with one another in the region of the semiconductor body between the two trenches.

In the case of the production of compensation components, vertical structures and lateral structures each have their own advantages and disadvantages:

In the case of vertical structures, the source electrode and the drain electrode can be produced considerably more easily on the surfaces of the semiconductor body lying opposite one another than the source and drain in lateral structures. However, in the case of vertical structures, the creation of a drift path receiving a blocking voltage from n-conducting and p-conducting regions alternating with one another and extending in the vertical direction using the build-up technique by repeated epitaxy with respectively successive ion implantation and diffusion, for example using what is known as CoolMOS technology, is relatively complex. In the case of lateral structures, on the other hand, the n-conducting and p-conducting compensation regions alternating with one another can be produced much more easily in comparison with the build-up technique of the vertical structures, in that n-conducting and p-conducting layers are successively applied to a semiconductor wafer by epitaxy. If appropriate, doping by implantation may also be carried out instead of epitaxy. However, as already mentioned above, the source and drain terminals are problematical in the case of lateral structures, since the layers forming the compensation regions have to be connected to the source and drain with as little impedance as possible. So far, that has only been possible with the aid of complex trench technology with subsequent filling.

To sum up, therefore, in the case of vertical structures the creation of the drift path is very complex, while in the case of lateral structures the source and drain terminals cause considerable problems.

Due to the difficulties presented above, so far compensation components have only been produced as vertical transistors, using a plurality of epitaxial layers for the build-up of the drift path. The ultimately column-like doping of the n-conducting and p-conducting regions is respectively introduced into the epitaxial layers with the aid of implantation.

Another, likewise complex method for producing a vertical transistor is to create the drift path by introducing the doping into very deeply etched trenches through the use of various processes (see U.S. Pat. No. 4,754,310).

SUMMARY OF THE INVENTION

It is accordingly an object of the invention to provide a compensation component and a process for producing the compensation component, which overcome the hereinafore-mentioned disadvantages of the heretofore-known devices and processes of this general type and in which a drift path and source and drain terminals can be produced in a simple way.

With the foregoing and other objects in view there is provided, in accordance with the invention, a compensation component, comprising a trough-shaped trench having side surfaces and a bottom surface. A drift path is disposed between two active zones. The drift path has a stacked sequence of layers of p-conducting and n-conducting regions. The drift path with the p-conducting and n-conducting regions is extended along the side surfaces and the bottom surface of the trench.

With the objects of the invention in view, there is also provided a process for producing a compensation component, which comprises providing a semiconductor body having a surface. A trench having a bottom surface and side walls is introduced into the semiconductor body using an anisotropic etching agent. p-conducting and n-conducting layers are alternately provided on the bottom surface and the side walls of the trench. The p-conducting and n-conducting layers are removed from the surface of the semiconductor body in a planarizing step leaving a remaining groove on the p-conducting and n-conducting layers. The remaining groove is filled with an insulating material or silicon.

In the case of a field-effect resistor used as a compensation component, the two active zones between which the drift path extends are the source zone and the drain zone. The sequence of layers forming the drift zone is then stacked in a direction perpendicular to a joining line between the source zone and the drain zone. The individual layers run with their longitudinal extent in the region between the source zone and the drain zone.

In accordance with another feature of the invention, a broad groove or trench is therefore etched into a silicon semiconductor body through the use, for example, of a KOH etching agent. In this case, the silicon semiconductor body is selected according to the desired voltage for which the compensation component is to be used.

The KOH etching agent is known to have the property of stopping the etching in a silicon body on a (111) plane, while all other lattice planes of the silicon are etched. A groove or trench produced in this way on a (100) silicon substrate therefore has a wall inclination of approximately 55°.

P-conducting and n-conducting layers are alternately applied to the silicon body prepared in this way and provided with a trench with a wall inclination of approximately 55°. That can take place by doped epitaxy or by epitaxy and subsequent implantation. The layer thickness of the individual layers which later form the drift path in this case can be adapted to the requirements for the compensation component. In principle, the layers can be all the thinner the lower the thermal loading.

Once the desired number of layers have been created in the groove or trench, a planarizing step is performed, in which the layers applied to the semiconductor body are removed back to the original surface of the semiconductor body or wafer. A chemical-mechanical polishing (CMP) or an anisotropic etching may also be used in this case.

Should there still be one remaining trench, it is filled with oxide. However, it is also possible to already fill such a "residual trench" with lowly doped silicon during the epitaxial steps.

In the structure obtained in this way, p-conducting and n-conducting regions consequently lie next to one another on the surface of the semiconductor body and can be readily interconnected laterally. These connections may be used at the same time for active zones, for example of a transistor. For instance, a p-conducting well which later serves as a channel zone may be introduced transversely to the p-conducting and n-conducting regions, for example by implantation. A further implantation can be used both for the source zone and for the terminal for n-conducting regions, for example, on the side of the drain zone. Finally, a gate electrode is likewise produced in the customary way transversely to the p-conducting and n-conducting regions.

A compensation component with a vertical structure can be created by thinning the semiconductor body from its rear side by grinding and/or etching after filling the groove or trench with the p-conducting and n-conducting layers. The thinning is carried out to the extent that finally, for example, n-conducting regions can be connected from the rear side directly to a metal contact or indirectly through a further n-conducting layer to a drain terminal.

The compensation component according to the invention may advantageously be a MOS field-effect transistor, a junction field-effect transistor, an IGBT, a Schottky diode and so on.

The compensation component may be constructed, for example, for 600 V with a drift zone having a length of 40 μm. The n-conducting and p-conducting regions in this case have a thickness of approximately 2 μm and are in each case doped to the same level with 1.5 E 16 cm$^{-3}$ charge carriers. Consequently, breakdown voltages of approximately 630 V can be achieved with an on resistance $R_{on}$ between the drain and source of 7 ohms mm$^2$.

The doping in the individual layers can be varied according to the desired area of application for the compensation component. For this purpose, for example, the electric field may be built up in such a way that it is present throughout the structure of the layers and not predominantly at the boundary surface with respect to an oxide filling in the residual trench. Furthermore, it is possible to compensate for the longer path of the current through the lower-lying layers by increased doping in these layers and consequently by a lower resistance (in this respect, also see U.S. Pat. No. 4,754,310).

Other features which are considered as characteristic for the invention are set forth in the appended claims.

Although the invention is illustrated and described herein as embodied in a compensation component and a process for producing the compensation component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
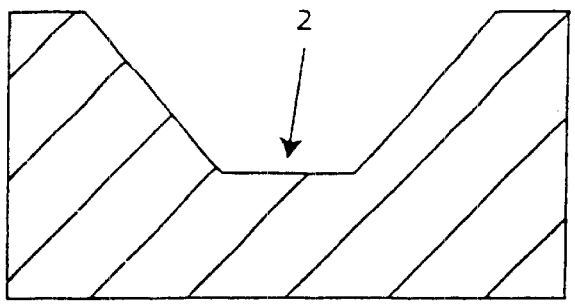
FIGS. 1 to 4 are various diagrammatic, sectional views illustrating production of a compensation component according to the invention.

Referring now to the figures of the drawings in detail and first, particularly, to FIG. 1 thereof, there is seen a silicon semiconductor body 1 including a (100) silicon substrate. A broad groove is introduced into this silicon body 1 with the aid of a KOH etching agent. The etching performed with this etching agent stops on a (111) plane, so that a trough-shaped groove or trench 2 is created. The groove 2 has a wall inclination of approximately 55°.

If appropriate, other etching agents apart from KOH may also be used. An isotropic etching agent, for example, leads to a U shape of the groove 2.

Therefore, in the case of the present invention, the groove 2 need not have a wall inclination of 55°. Rather, other wall inclinations of up to 90° are possible, giving the groove a U shape.

The silicon body 1 may be undoped. It may, however, also have an n-doping or a p-doping, which ultimately depends on voltages for which the finished compensation component is to be used.

N-conducting layers 3 and p-conducting layers 4 are successively applied to the structure shown in FIG. 1, either by doped epitaxy or by epitaxy and subsequent implantation or other doping. The thickness of these layers 3, 4 may be approximately 2 μm. A suitable doping concentration is, for instance, 1.5 E 16 cm$^{-3}$. It goes without saying, however, that other layer thicknesses and doping concentrations are also possible.

Figure 2:
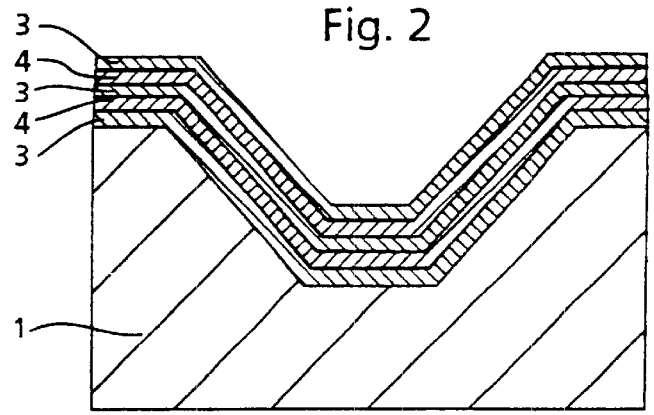

In the example of FIG. 2, only five layers 3, 4 are shown. If appropriate, however, more layers can be introduced into the groove 2, so that the latter is largely filled with these layers 3, 4, which alternate with one another.

Figure 3:
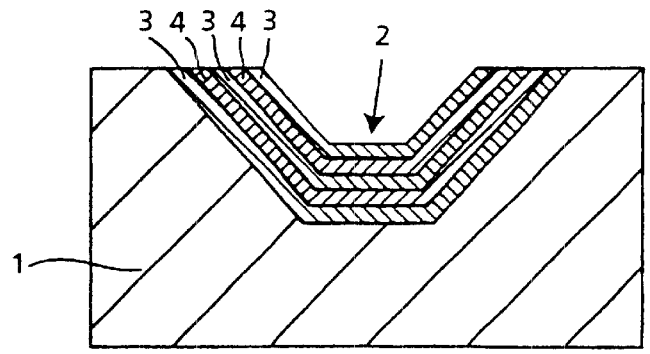

Once the desired number of layers 3, 4 have been introduced into the groove 2 or onto the silicon body 1, a planarizing step is performed, in which the layers 3, 4 are etched back on the surface of the silicon body 1, so that the structure shown in FIG. 3 is created. If appropriate, a CMP step and/or an anisotropic etching may also be used for this planarizing. The structure shown in FIG. 3 is obtained in this way.

The still-remaining groove 2 is then filled with silicon dioxide or some other insulating material. This filling of the residual groove may also be performed before the planarizing or may be omitted entirely. Similarly, it is also possible, however, to follow the epitaxial steps for forming the layers 3, 4 with a further epitaxial step, in which the groove 2 is filled with lowly doped silicon. The structure shown in FIG. 4, in which an oxide layer 5 fills the residual groove 2, is obtained in this way.

In the case of a U-shaped groove, the layers 3, 4 may, for example, be doped by implantation at an oblique angle.

Figure 4:
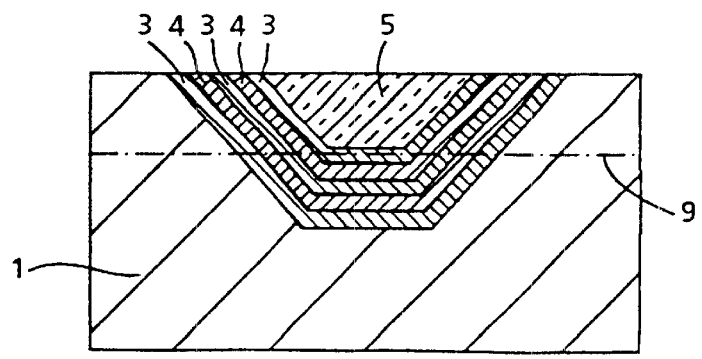

In the structure shown in FIG. 4, the n-conducting layers 3 and the p-conducting layers 4 lie next to one another on the surface of the silicon body 1 as n-conducting and p-conducting regions and can be laterally interconnected, i.e. in the direction of the sides in FIG. 4. These connections can be used at the same time for source, body and drain zones of a MOS transistor.

Figure 5:
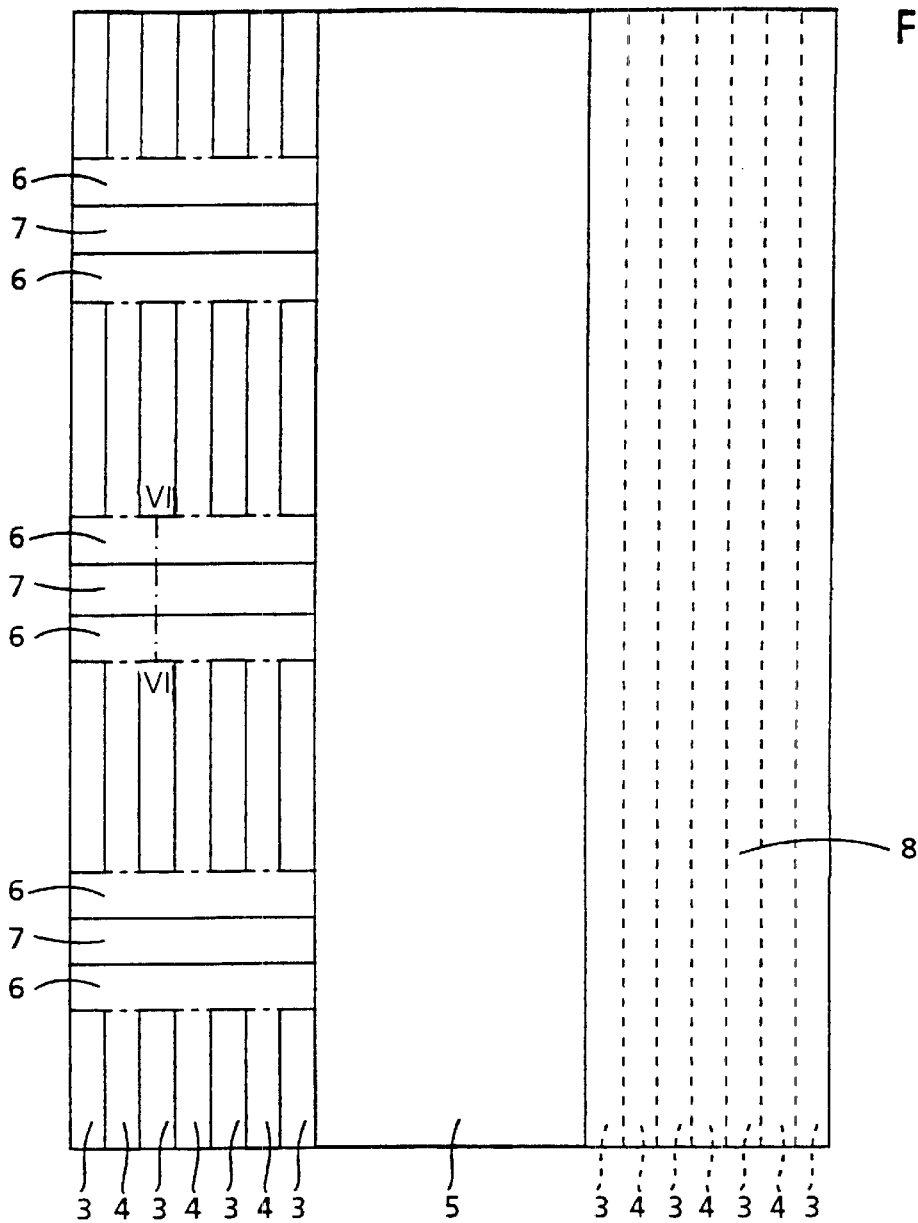
FIG. 5 is an enlarged plan view of a lateral high-voltage MOS transistor.
Figure 6:
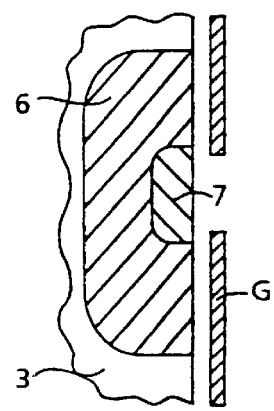
FIG. 6 is an enlarged, fragmentary, sectional view taken along a line VI—VI in the transistor of FIG. 5, in the direction of the arrows.

For instance, as can be seen from the plan view of FIG. 5 and the section of FIG. 6, a p-conducting well 6, which serves in the finished compensation component as a body zone or channel, can be implanted transversely to the n-conducting and p-conducting layers 3 and 4. A further implantation then allows both a source zone 7 and a drain zone 8, which are both ndoped, to be introduced. The drain zone 8 serves as a terminal for the n-conducting regions of the layers 3 on the drain side. The p-conducting regions of the layers 4 are connected through the body zone 6. A gate electrode G can likewise be provided transversely to the layers 3, 4 above the body zone 6 on a gate insulator, for example of silicon dioxide.

If a compensation component is to be formed in a vertical structure, the structure of FIG. 4 is thinned from the rear side by grinding and etching to the extent that the n-conducting layers 3 can be connected from the rear side directly to a metal contact or indirectly through a further n-conducting layer to a drain terminal. This thinning is indicated in FIG. 4 by a dash-dotted line 9. In the case of the structure of FIG. 4 which is thinned in this way as far as the dash-dotted line 9, the regions to the left and right of the insulator filling 5 are then provided with transistor cells and source and gate terminals, which may take place in the same way as in FIGS. 5 and 6, while the drain terminal is provided on the rear side, that is in the region of the dashed line 9.

We claim:

1. A compensation component, comprising:
   a trough-shaped trench having side surfaces and a bottom surface;
   two active zones; and
   a drift path disposed between said two active zones, said drift path having a stacked sequence of layers of p-conducting and n-conducting regions, and said drift path with said p-conducting and n-conducting regions extended along said side surfaces and said bottom surface of said trench.

2. The compensation component according to claim 1, wherein said side surfaces of said trench extend from said bottom surface substantially obliquely upward, defining an opening of said trench being wider than said bottom surface.

3. The compensation component according to claim 1, including an oxide filling disposed at said trench, in addition to said n-conducting and p-conducting regions.

4. The compensation component according to claim 1, wherein said side surfaces of said trench have a wall inclination of approximately 55°.

5. The compensation component according to claim 1, including a source zone, a body zone and a gate disposed on one side of said trench, and a drain zone disposed on another side of said trench, forming a MOS field-effect transistor.

6. The compensation component according to claim 1, including a source zone, a body zone and a gate disposed on one side of said trench, and a drain zone disposed on said bottom surface of said trench, forming a MOS field-effect transistor.

7. A MOS field-effect transistor, comprising:
   a trough-shaped trench having side surfaces and a bottom surface;
   two active zones; and
   a drift path disposed between said two active zones, said drift path having a stacked sequence of layers of p-conducting and n-conducting regions, and said drift path with said p-conducting and n-conducting regions being led around said side surfaces and said bottom surface of said trench.

8. A junction field-effect transistor, comprising:
   a trough-shaped trench having side surfaces and a bottom surface;
   two active zones; and
   a drift path disposed between said two active zones, said drift path having a stacked sequence of layers of p-conducting and n-conducting regions, and said drift path with said p-conducting and n-conducting regions being led around said side surfaces and said bottom surface of said trench.

9. An IGBT, comprising:
   a trough-shaped trench having side surfaces and a bottom surface;
   two active zones; and
   a drift path disposed between said two active zones, said drift path having a stacked sequence of layers of p-conducting and n-conducting regions, and said drift path with said p-conducting and n-conducting regions being led around said side surfaces and said bottom surface of said trench.

10. A Schottky diode, comprising:
    a trough-shaped trench having side surfaces and a bottom surface;
    two active zones; and
    a drift path disposed between said two active zones, said drift path having a stacked sequence of layers of p-conducting and n-conducting regions, and said drift path with said p-conducting and n-conducting regions being led around said side surfaces and said bottom surface of said trench.

11. A compensation component, comprising:
    a semiconductor body having a trough-shaped trench formed therein, said trench having side surfaces and a bottom surface;
    two active zones on said semiconductor body; and
    a drift path disposed between said two active zones, said drift path having a stacked sequence of layers of p-conducting and n-conducting regions, and said drift path with said p-conducting and n-conducting regions extended along said side surfaces and said bottom surface of said trench.

* * * * *